United States Patent
Kuwajima

(10) Patent No.: US 6,801,093 B2
(45) Date of Patent: Oct. 5, 2004

(54) FREQUENCY SYNCHRONOUS APPARATUS AND FREQUENCY SYNCHRONOUS CONTROL METHOD

(75) Inventor: Naoki Kuwajima, Kodama-gun (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/153,648

(22) Filed: May 24, 2002

(65) Prior Publication Data

US 2002/0180536 A1 Dec. 5, 2002

(30) Foreign Application Priority Data

May 29, 2001 (JP) ........................................ 2001-160421

(51) Int. Cl.[7] ................................................ H03L 7/00
(52) U.S. Cl. .................................... 331/18; 331/177 R
(58) Field of Search ............................. 331/18, 40, 44, 331/1 R, 172, 177 R, 14, 15, 16, 17

(56) References Cited

U.S. PATENT DOCUMENTS

| | | | | |
|---|---|---|---|---|
| 3,573,649 A | * | 4/1971 | West | 331/14 |
| 3,903,482 A | * | 9/1975 | Pausini et al. | 331/17 |
| 5,220,684 A | * | 6/1993 | Suize | 455/183.1 |
| 5,559,686 A | * | 9/1996 | Patel et al. | 363/43 |
| 6,072,842 A | | 6/2000 | Janesch et al. | |
| 6,078,224 A | * | 6/2000 | Ujiie | 331/10 |
| 6,150,888 A | * | 11/2000 | Nakazawa | 331/11 |

FOREIGN PATENT DOCUMENTS

| | | |
|---|---|---|
| JP | 62-088428 A | 4/1987 |
| JP | 5-268078 A | 10/1993 |
| JP | 5-327489 A | 12/1993 |
| JP | 2780613 B2 | 5/1998 |

* cited by examiner

Primary Examiner—Timothy P. Callahan
Assistant Examiner—Cassandra Cox
(74) Attorney, Agent, or Firm—Sughrue Mion, PLLC

(57) ABSTRACT

A frequency synchronous apparatus includes a switch, frequency division circuit, phase comparison circuit, frequency adjustment and calculation circuit, memory, conversion circuit, and voltage-controlled oscillator. The switch selects either one of a highly stable clock output and a reference clock output in accordance with a mode switching signal. The frequency division circuit divides the frequency of the synchronous clock. The phase comparison circuit detects the phase difference between an output clock from the frequency division circuit and an output clock from the switch, and outputs a phase difference value. The frequency adjustment and calculation circuit performs synchronous control so as to adjust the phase difference value output from the phase comparison circuit to 0, and outputs a synchronous control value at this time. The memory holds the synchronous control value output from the frequency adjustment and calculation circuit. The conversion circuit converts the synchronous control value into a control voltage value. The voltage-controlled oscillator outputs a synchronous clock on the basis of the control voltage value. The present invention also provides a frequency synchronous control method.

7 Claims, 5 Drawing Sheets

FREQUENCY SYNCHRONOUS APPARATUS AND FREQUENCY SYNCHRONOUS CONTROL METHOD

BACKGROUND OF THE INVENTION

1. Field of the Invention

The present invention relates to an apparatus and method for generating a clock synchronized with a reference clock by a PLL (Phase Locked Loop) method.

2. Description of the Prior Art

According to a conventional frequency synchronous method, degradation in the stability of a reference clock leads to degradation in the stability of the output frequency of a voltage-controlled oscillator (VCXO) following the reference clock. To solve this problem, there is provided an apparatus shown in FIG. 1. In this apparatus, a synchronous clock 109 output from a voltage-controlled oscillator 5 is branched and divided by a frequency division circuit 7. A frequency division circuit output 105 is compared with a reference clock 103 by a phase comparison circuit 4. A frequency adjustment and calculation circuit 1 receives phase difference data 106 from the phase comparison circuit 4, calculates such a control value as to eliminate the phase difference, and sends a control value 107 to a conversion circuit 3. The conversion circuit 3 sends a control voltage 108 to the voltage-controlled oscillator 5. Then, the voltage-controlled oscillator 5 outputs a synchronous clock 109 corresponding to the voltage. In this apparatus, a highly stable oscillator 52 is connected to the frequency adjustment and calculation circuit 1. The highly stable oscillator 52 monitors the reference clock, and restricts the follow-up performance of the synchronous clock output from the frequency synchronous apparatus to the reference clock.

Japanese Unexamined Patent Publication No. 5-268078 discloses an arrangement which holds a voltage value obtained when the reference clock and VCO clock synchronize with each other, and if the frequency difference between the reference clock and VCO exceeds the pulling range, switches the current voltage to the held voltage value to achieve phase locking. This arrangement enables quick recovery of re-synchronization when the frequency steps out.

However, the former apparatus requires the highly stable oscillator 52, which increases the circuit scale and cost. The latter apparatus is a means for re-synchronizing the synchronous clock with the reference clock when the synchronous clock changes. If the reference clock degrades, the current voltage is set to the held voltage value, and the voltage value of VCO is reset to a value used in synchronization. This inhibits a holdover state, and the frequency of the synchronous clock changes to a held frequency used in synchronization. That is, the synchronous clock disadvantageously coincides with the changed reference clock.

SUMMARY OF THE INVENTION

The present invention has been made to overcome the conventional drawbacks, and has as its object to provide a frequency synchronous apparatus and method capable of outputting a stable synchronous clock even when the frequency of a reference clock varies and the characteristics of a voltage-controlled oscillator change over time.

To achieve the above object, according to the first aspect of the present invention, there is provided a frequency synchronous apparatus for outputting a synchronous clock synchronized with a reference clock, comprising a switch which selects either one of a highly stable clock output and a reference clock output in accordance with a mode switching signal, a frequency division circuit which divides a frequency of the synchronous clock, a phase comparison circuit which detects a phase difference between an output clock from the frequency division circuit and an output clock from the switch, and outputs a phase difference value, a frequency adjustment and calculation circuit which performs synchronous control so as to adjust the phase difference value output from the phase comparison circuit to 0, and outputs a synchronous control value at this time, a memory which holds the synchronous control value output from the frequency adjustment and calculation circuit, a conversion circuit which converts the synchronous control value output from the frequency adjustment and calculation circuit into a control voltage value, and a voltage-controlled oscillator which outputs a synchronous clock on the basis of the control voltage value.

The memory in the first aspect holds a synchronous control value output from the frequency adjustment and calculation circuit when the highly stable clock is output in accordance with the mode switching signal, and two synchronous control values output from the frequency adjustment and calculation circuit when a frequency of the highly stable clock is set to a frequency higher by a predetermined value and to a frequency lower by the predetermined value.

To achieve the above object, according to the second aspect of the present invention, there is provided a frequency synchronous apparatus for outputting a synchronous clock synchronized with a reference clock, comprising a frequency division circuit which divides a frequency of the synchronous clock, a phase comparison circuit which detects a phase difference between an output clock from the frequency division circuit and a reference clock, and outputs a phase difference value, a frequency adjustment and calculation circuit which performs synchronous control so as to adjust the phase difference value output from the phase comparison circuit to 0, and outputs a synchronous control value at this time, a memory which holds a predetermined synchronous control value output from the frequency adjustment and calculation circuit, a conversion circuit which converts the synchronous control value output from the frequency adjustment and calculation circuit into a control voltage value, and a voltage-controlled oscillator which outputs a synchronous clock on the basis of the control voltage value.

The memory in the second aspect holds a synchronous control value output from the frequency adjustment and calculation circuit when a highly stable clock is input to the phase comparison circuit instead of the reference clock, and two synchronous control values output from the frequency adjustment and calculation circuit when a frequency of the highly stable clock is set to a frequency higher by a predetermined value and to a frequency lower by the predetermined value.

To achieve the above object, according to the third aspect of the present invention, there is provided a frequency synchronous control method of controlling a voltage-controlled oscillator to output a synchronous clock synchronized with a reference clock, comprising the steps of detecting a phase difference between the synchronous clock and the reference clock, performing synchronous control so as to eliminate the phase difference, controlling the voltage-controlled oscillator on the basis of a synchronous control value at this time, and holding the synchronous control value in a memory.

In the frequency synchronous control method of the third aspect, a synchronous control value which adjusts a phase difference value between the synchronous clock and a highly stable clock instead of the reference clock to 0, and two synchronous control values output which adjust the phase difference value from the synchronous clock to 0 when a frequency of the highly stable clock is set to a frequency higher by a predetermined value and to a frequency lower by the predetermined value can be held in the memory in advance.

In the frequency synchronous control method of the third aspect, when synchronous control is so performed as to eliminate the phase difference between the synchronous clock and the reference clock, whether a synchronous control value which adjusts the phase difference value to 0 is a value falling within a control range whose upper and lower limit values are the two synchronous control values held in the memory in advance can be checked, if the synchronous control value is the value falling within the control range, synchronous control which adjusts the phase difference value to 0 can be performed, and if the synchronous control value is a value falling outside the control range, a previous control value can be directly used.

In the frequency synchronous control method of the third aspect, on the basis of the synchronous control value held in the memory as a result of synchronous control which eliminates the phase difference between the synchronous clock and the reference clock, a control range of the voltage-controlled oscillator using the synchronous control value as a reference can be so corrected as to coincide with a control range whose upper and lower limit values are the two control values held in the memory in advance, and synchronous control values corresponding to new upper and lower limit values can be held in the memory.

In the frequency synchronous control method of the third aspect, when synchronous control is so performed as to eliminate the phase difference between the synchronous clock and the reference clock, whether the synchronous control value which adjusts the phase difference value to 0 is a value falling within a control range based on the new upper and lower limit values can be checked, if the synchronous control value is the value falling within the control range, synchronous control which adjusts the phase difference value to 0 can be performed, and if the synchronous control value is a value falling outside the control range, a previous control value can be directly used.

As is apparent from the above aspects, the present invention can output a stable synchronous clock within a predetermined range even if the stability of the reference clock degrades and the characteristic of the voltage-controlled oscillator changes over time.

The present invention does not require any oscillator for detecting the stability of the reference clock, and can reduce the cost.

In the present invention, the control range based on the clock of the highly stable oscillator is held in the memory in advance. A control value (control voltage value) when the synchronous clock synchronizes with the reference clock is periodically monitored, and the control range is corrected on the basis of this control value. The present invention can always output a stable synchronous clock even if the stability of the reference clock degrades or the characteristic of the voltage-controlled oscillator changes over time.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF THE PREFERRED EMBODIMENTS

Figure 1:
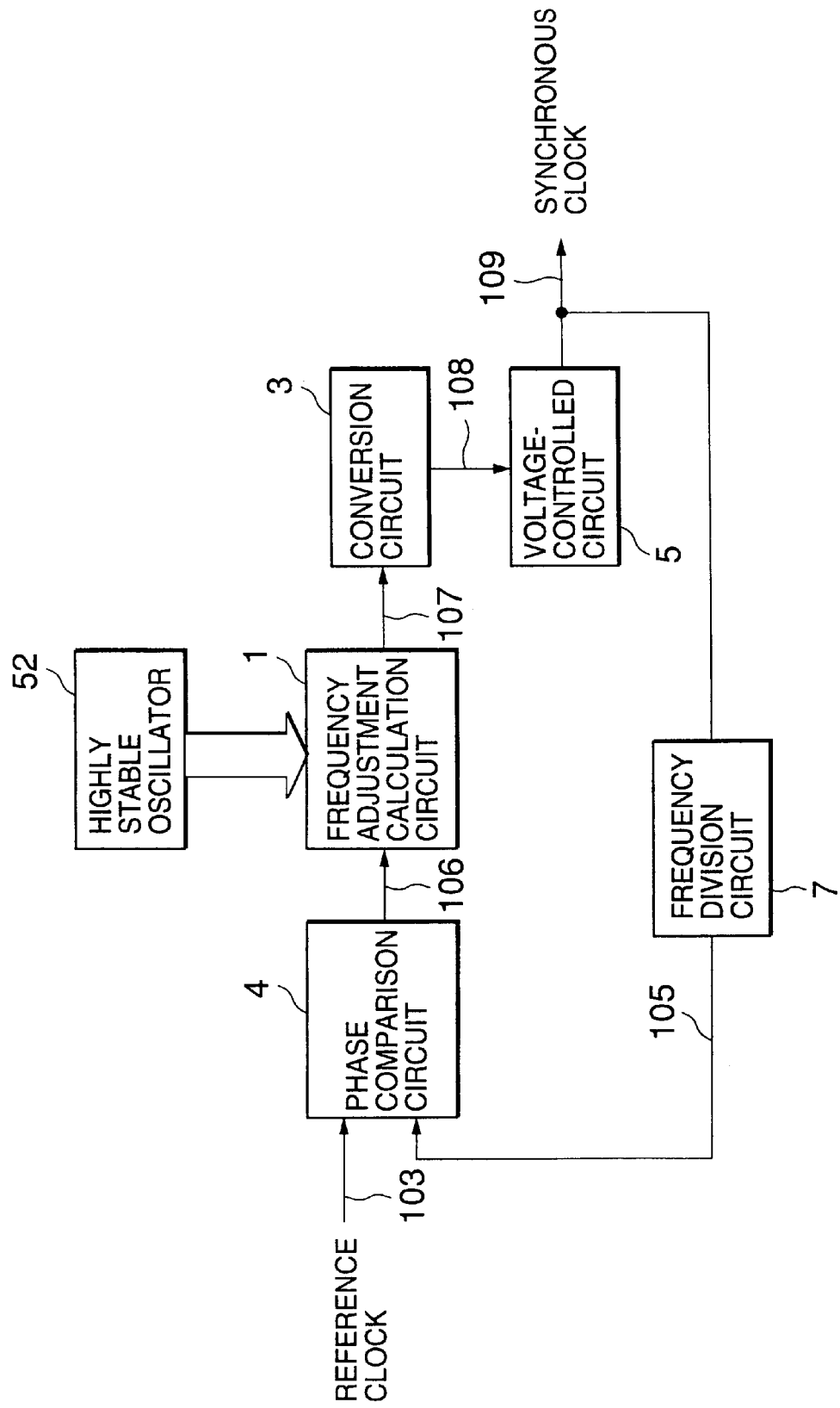
FIG. 1 is a block diagram showing an arrangement of a conventional frequency synchronous apparatus.
Figure 2:
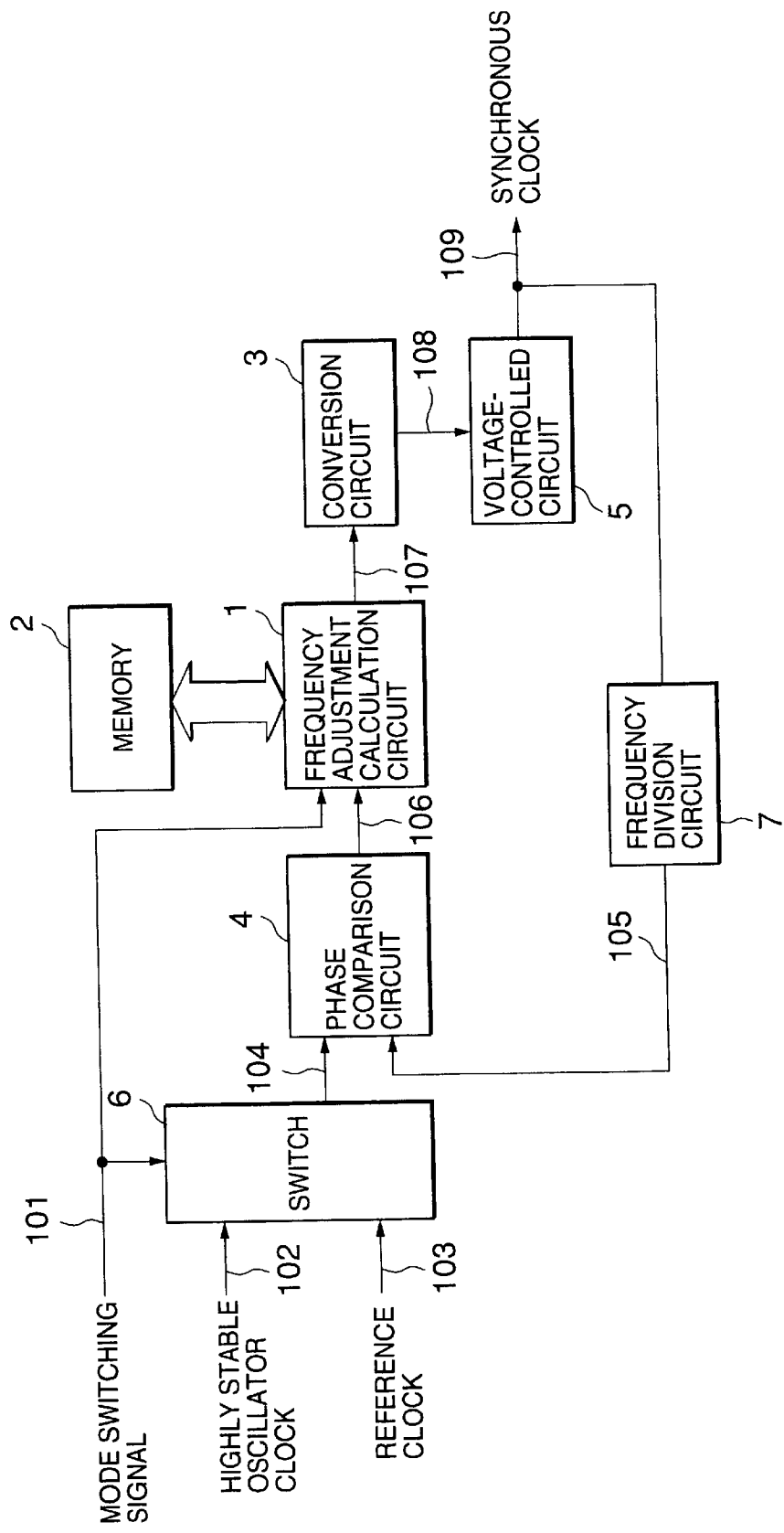
FIG. 2 is a block diagram showing an arrangement of a frequency synchronous apparatus according to the present invention.

FIG. 2 is a block diagram showing an arrangement of a frequency synchronous apparatus according to the present invention. This apparatus comprises a switch 6 which selects either one of a clock 102 from a highly stable oscillator and a reference clock 103 in accordance with a mode switching signal 101 so as to output the selected one. The apparatus further comprises a phase comparison circuit 4 which receives a REF clock 104 output from the switch 6 and a frequency-divided clock 105, detects the phase difference between them, and outputs phase difference data 106. A frequency adjustment and calculation circuit 1 connected to the output of the phase comparison circuit 4 receives the mode switching signal 101. The frequency adjustment and calculation circuit 1 is connected to a memory 2.

When the mode switching signal 101 represents an adjustment mode in which the clock 102 of the highly stable oscillator is selected, the frequency adjustment and calculation circuit 1 calculates such a synchronous control value 107 as to adjust (synchronize) the phase difference value of the phase difference data 106 input from the phase comparison circuit 4 to 0. Then, the frequency adjustment and calculation circuit 1 writes the control value 107 in the memory 2. In the adjustment mode, the frequency adjustment and calculation circuit 1 also writes, in the memory 2, synchronous control values (±F control values) 107 for eliminating the phase difference from the synchronous clock when the frequency of the clock 102 of the highly stable oscillator is higher and lower by a predetermined value.

When the mode switching signal 101 represents an operation mode in which the reference clock 103 is selected, the frequency adjustment and calculation circuit 1 calculates and outputs a synchronous control value 107 for synchronous control with respect to a synchronous clock output from the frequency synchronous apparatus. At the same time, the frequency adjustment and calculation circuit 1 writes the synchronous control value 107 in the memory 2 or another memory (not shown).

A conversion circuit 3 which has received the synchronous control value 107 converts the synchronous control value 107 from digital level into analog level. The conversion circuit 3 outputs the analog value 107 as a control voltage value 108 to a voltage-controlled oscillator 5. The voltage-controlled oscillator 5 outputs a synchronous clock 109 corresponding to the control voltage value 108.

A frequency division circuit 7 divides the frequency of the branched synchronous clock 109, and sends the frequency-divided clock 105 to the phase comparison circuit 4.

The operation of the frequency synchronous apparatus shown in FIG. 2 will be explained.

The mode switching signal 101 is set to the adjustment mode. At this time, the switch 6 outputs the clock 102 (frequency f0) of the highly stable oscillator as the REF clock 104 to the phase comparison circuit 4. The phase comparison circuit 4 compares the phase of the frequency-divided clock 105 output from the frequency division circuit 7 with the phase of the clock 102. Then, the phase comparison circuit 4 outputs the phase difference data 106 to the frequency adjustment and calculation circuit 1. The frequency adjustment and calculation circuit 1 which has received the mode switching signal 101 calculates, from the input phase difference data 106, such a synchronous control value 107 as to eliminate the phase difference between the clock 102 of the highly stable oscillator and the frequency-divided clock 105 output from the frequency division circuit 7. The frequency adjustment and calculation circuit 1 outputs the calculated synchronous control value 107. The synchronous control value 107 is converted into the control voltage 108 by the conversion circuit 3. The synchronous clock 109 based on the control voltage value 108 is output from the voltage-controlled oscillator 5. The frequency adjustment and calculation circuit 1 writes the synchronous control value 107 in the memory 2.

In the adjustment mode, the frequency (f0) of the clock 102 of the highly stable oscillator is set high by a predetermined value. Also in this case, the same synchronous control as the above-described one is executed. More specifically, the phase comparison circuit 4 sends the phase difference data 106 to the frequency adjustment and calculation circuit 1. The frequency adjustment and calculation circuit 1 calculates such a synchronous control value 107 as to eliminate the phase difference between the frequency-divided clock 105 and the clock 102 whose frequency is higher by the predetermined value. The frequency adjustment and calculation circuit 1 outputs the calculated synchronous control value 107. The voltage-controlled oscillator 5 undergoes synchronous control using the resultant synchronous control value (+F control value) 107. The synchronous control value (+F control value) 107 is written in the memory 2.

Further, the frequency (f0) of the clock 102 of the highly stable oscillator is set low by the predetermined value. Also in this case, the same synchronous control processing as the aforesaid one is performed for the phase comparison circuit 4 and frequency adjustment and calculation circuit 1. The synchronous control value (−F control value) 107 at this time is written in the memory 2.

The range whose upper and lower limits are defined by the +F and −F control values (i.e., the control voltage range of the voltage-controlled oscillator 5 corresponding to these synchronous control values) is set in the memory 2 as the control range of the frequency synchronous apparatus of the present invention.

Figure 3:
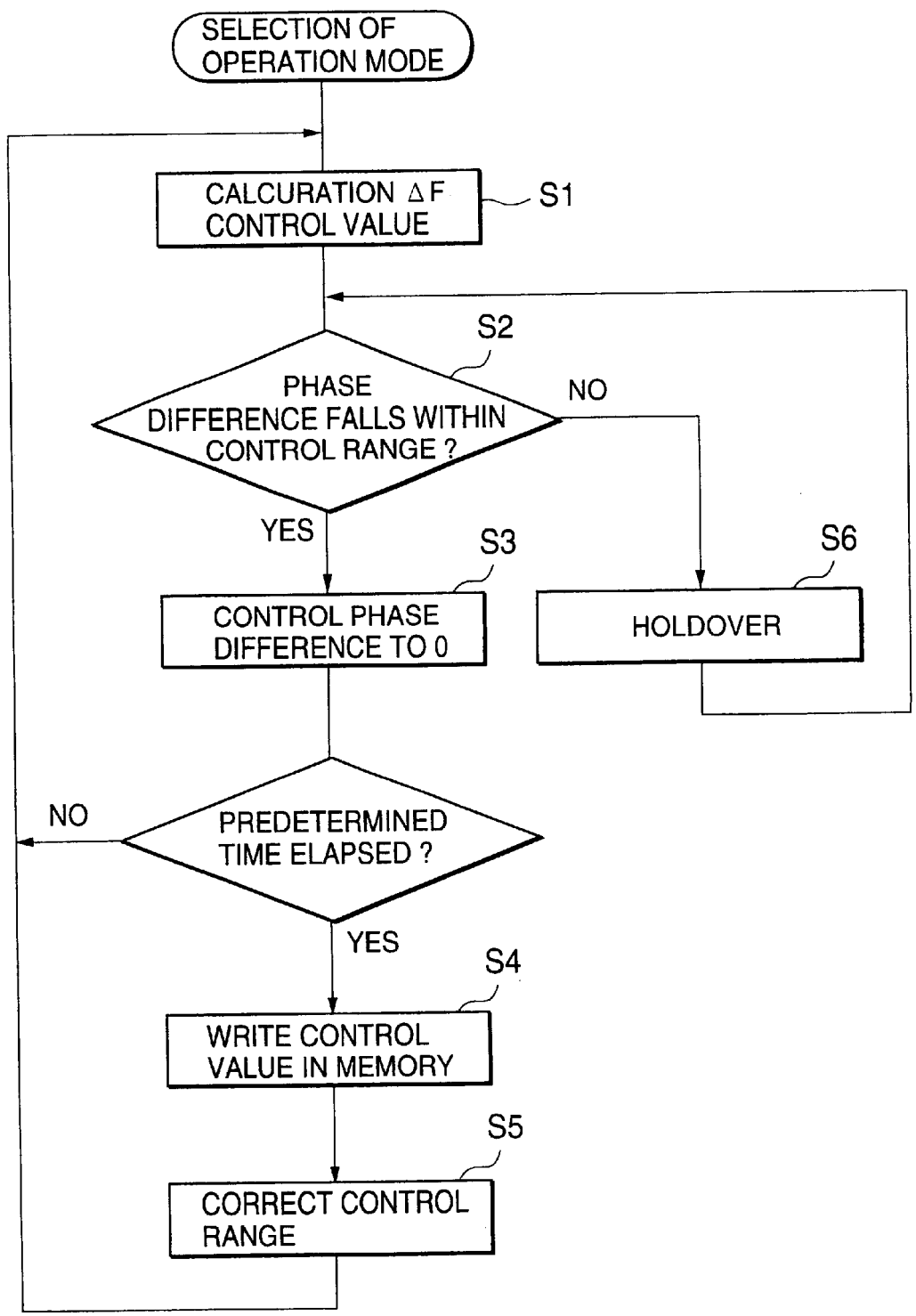
FIG. 3 is a flow chart showing an example of a frequency synchronous control method according to the present invention.

An operation when the mode switching signal 101 is set to the operation mode (the user actually uses this apparatus) is shown in the flow chart of FIG. 3.

At this time, the switch 6 outputs the reference clock 103 serving as the REF clock 104 to the phase comparison circuit 4. When the frequency synchronous apparatus is activated, the frequency adjustment and calculation circuit 1 is synchronously controlled by using the clock 102 (frequency f0) of the highly stable oscillator in advance. The voltage-controlled oscillator 5 is activated based on the synchronous control value 107 written in the memory 2. For synchronous control, the frequency adjustment and calculation circuit 1 calculates a minimum control step value $\Delta F$ (step S1). $\Delta F$ depends on the precision and adjustment precision of the conversion circuit 3 for converting the synchronous control value 107 into a control voltage value. $\Delta F$ is basically set to a value much smaller than the control range. The minimum control step value $\Delta F$ can also be calculated in the adjustment mode and written in the memory 2.

The frequency adjustment and calculation circuit 1 detects and determines whether the input phase difference data 106 falls within the range of the +F control value to the −F control value (whether the synchronous control value 107 which eliminates the phase difference falls within this range) (step S2). If NO in step S2, the control suspends, and the state of the previous synchronous control value is set as a holdover state (step S6). Then, the flow returns to determination of whether input phase difference data falls within the control range. If YES in step S2, synchronous control is so performed as to adjust the phase difference data 106 to 0 by using the minimum control step value $\Delta F$ (step S3). This makes the synchronous clock 109 coincide with the frequency of an externally input reference clock 103. The frequency adjustment and calculation circuit 1 periodically writes this synchronous control value 107 in the memory 2 or another memory (not shown) (step S4). The control voltage range is changed on the basis of the synchronous control value 107 periodically written in the memory. That is, the frequency adjustment and calculation circuit 1 writes, in the memory 2 or and calculation circuit 1 writes, in the memory 2 or another memory (not shown), synchronous control values serving as the upper and lower limits of a new control range such that the control range is changed to a control range set by the +F and −F control values written in the memory 2 by actually using the reference clock 103 and the synchronous control value 107 subjected to synchronous control as a reference (step S5). After that, the frequency adjustment and calculation circuit 1 refers to this new control range to determine whether an input phase difference value falls within the control range.

Step S4 is periodically executed. For example, step S4 is performed at a cycle of several days or several weeks depending on the operation form. The operation in step S5 can be necessarily executed after step S4, but may be performed at a longer cycle than that of step S4.

Figure 4:
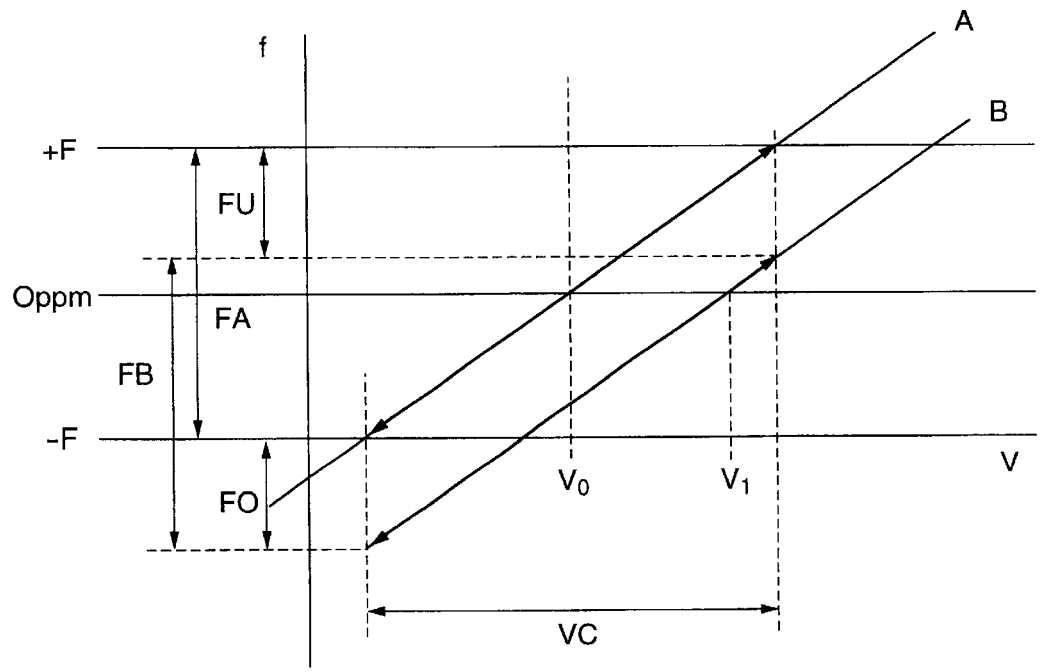
FIG. 4 is a graph showing changes in the characteristic of a voltage-controlled oscillator.

The change of the control range will be explained with reference to FIGS. 4 and 5.

The characteristics of the voltage-controlled oscillator 5 change over time, and especially, the characteristic of the control voltage value and frequency output value (V-F characteristic) may change. At this time, the range (control range) of control values written in the memory 2 shifts to an unadjustable range. To prevent this, the synchronous control value 107 used for synchronous control between the reference clock 103 and a synchronous clock output from the frequency synchronous apparatus is written in the memory 2 or another memory, and the control voltage range is adjusted. In general, as represented by straight lines A and B in FIG. 4, the control voltage value and frequency output value of the voltage-controlled oscillator change over time though the gradient is assumed to be kept unchanged. Owing to this change over time, the control voltage value serving as a reference frequency (0 ppm) changes from V0 to V1 in synchronous control. FIG. 4 shows this state. In this case, a control voltage range VC does not change, and the range to be adjusted is represented by FB in FIG. 4. As a result, an uncontrollable range FU and a range F0 controlled to the outside of the standard are generated (in this case, the frequency standard is the range of +F to −F).

Figure 5:
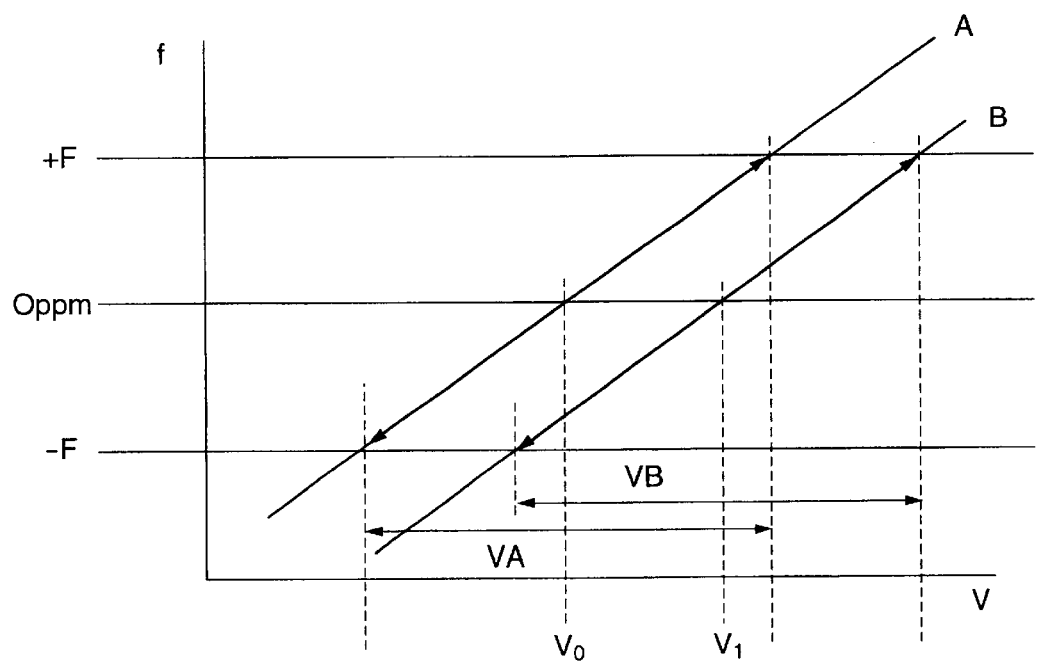
FIG. 5 is a graph showing an example of correcting the characteristic of the voltage-controlled oscillator.

In the control method of the present invention, as shown in FIG. 5, synchronous control between a synchronous clock output from the frequency synchronous apparatus and the reference clock corrects the control voltage range from VA to VB by using, as a reference, a synchronous control value (V1) which is periodically written in the memory and eliminates the phase difference. Accordingly, the control method corrects the control range upon the change of the invention can realize control within the range of +F to −F set as a synchronous clock frequency standard in system operation.

Figure 6:
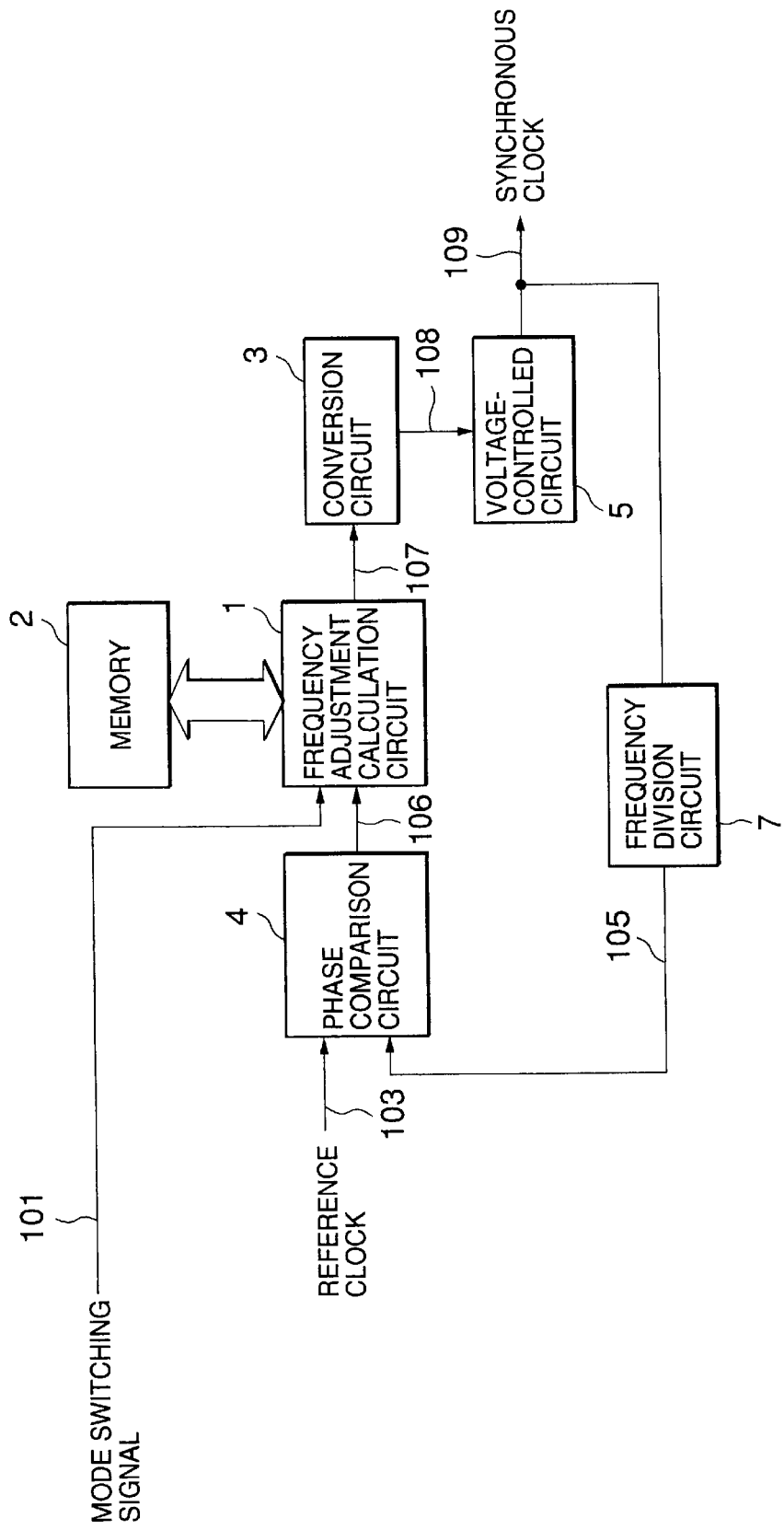
FIG. 6 is a block diagram showing another arrangement of the frequency synchronous apparatus according to the present invention.

FIG. 6 shows the arrangement of a frequency synchronous apparatus according to another embodiment of the present invention. The basic arrangement is the same as that in FIG. 2 except that the switch 6 is omitted. In this embodiment, when a mode switching signal 101 is set to the adjustment mode, a clock from a highly stable oscillator is input to a phase comparison circuit 4 instead of a reference clock 103. In the operation mode, the reference clock 103 is input to a phase comparison circuit 4. The remaining arrangement and operation are the same as those described above with reference to FIG. 2. In this manner, this embodiment can omit part of the circuit.

In these two embodiments, for example, the reference clock 103 has a precision of about $1 \times 10^{-11}$, and the frequency f0 of the highly stable oscillator is 10 MHz. The range of ±F is 10 MHz±0.05 ppm, $\Delta F$ is 10 MHz×$10^{-11}$, the frequency division ratio is 1/2500, and the reference clock is 4 kHz.

What is claimed is:

1. A frequency synchronous apparatus for outputting a synchronous clock, comprising:

a switch which selects either one of a highly stable clock output and a reference clock output in accordance with a mode switching signal;

a frequency division circuit which divides a frequency of the synchronous clock;

a phase comparison circuit which detects a phase difference between an output clock from said frequency division circuit and an output clock from said switch, and outputs a phase difference value;

a frequency adjustment and calculation circuit which performs synchronous control so as to adjust the phase difference value output from said phase comparison circuit to 0, and outputs a synchronous control value;

a memory which holds the synchronous control value output from said frequency adjustment and calculation circuit at least when the highly stable clock is output in accordance with the mode switching signal, said memory further holding at least two synchronous control values output from said frequency adjustment and calculation circuit when a frequency of the highly stable clock is set to a predetermined higher frequency and to a predetermined lower frequency;

a conversion circuit which converts the synchronus control value output from said frequency adjustment and calculation circuit into a control voltage value; and a voltage-controlled oscillator which outputs a synchronous clock on the basis of the control voltage value.

2. A frequency synchronous apparatus for outputting a synchronous clock, comprising:

a frequency division circuit which divides a frequency of the synchronous clock;

a phase comparison circuit which detects a phase difference between an output clock from said frequency division circuit and a reference clock, and outputs a phase difference value;

a frequency adjustment and calculation circuit which performs synchronous control so as to adjust the phase difference value output from said phase comparison circuit to 0, and outputs a synchronous control value;

a memory which holds a synchronous control value output from said frequency adjustment and calculation circuit at least when a highly stable clock is input to said phase comparison circuit instead of the reference clock, said memory further holding at least two synchronous control values output from said frequency adjustment and calculation circuit when a frequency of the highly stable clock is set to a predetermined higher frequency and to a predetermined lower frequency;

a conversion circuit which converts the synchronous control value output from said frequency adjustment and calculation circuit into a control voltage value; and a voltage-controlled oscillator which outputs a sychronous clock on the basis of the control voltage value.

3. A frequency synchronous control method of controlling a voltage-controlled oscillator to output a synchronous clock, comprising the steps of:

detecting a phase difference between the synchronous clock and a reference clock to derive a synchronous control value that is held in memory;

detecting a further phase difference between the synchronous clock and a highly stable clock, the highly stable clock being of different origin than the reference clock, to derive an additional synchronous control value that is held in memory;

detecting yet further phase differences between the synchronous clock and the highly stable clock when the highly stable clock is set to a predetermined higher frequency and to a predetermined lower frequency, to derive yet addition synchronous control values held in memory in advance;

performing synchronous control using the synchronous control values so as to eliminate any phase difference; and controlling the voltage-controlled oscillator on the basis of the synchronous control values.

4. A method according to claim 3, wherein when a synchronous control value which eliminates a phase difference is a value falling within a control range, said control range delimited by the upper and lower limit values of the two synchronous control values held in the memory in advance, synchronous control is performed, and if the synchronous control value is a value falling outside the control range, a previous control value is used.

5. A method according to claim 3, wherein, on the basis of the synchronous control value held in the memory as a result of synchronous control which eliminates the phase difference between the synchronous clock and the reference clock, a control range of the voltage-controlled oscillator using the synchronous control value as a reference is corrected so as to coincide with a control range whose upper and lower limit values are the two control values held in the memory in advance, and synchronous control values corresponding to new upper and lower limit values are held in the memory.

6. A method according to claim 5, wherein when the synchronous control value which eliminates the phase difference is a value falling within a control range based on the new upper and lower limit values, synchronous control which eliminates the phase difference value is performed, and if the synchronous control value is a value falling outside the control range, a previous control value is used.

7. A method according to claim 3, wherein when synchronous control is performed so as to eliminate the phase difference between the synchronous clock and the reference clock, a predetermined control step value is calculated, and synchronous control is performed based on the control step value.

* * * * *